US009413328B2

(12) United States Patent
Tsukamoto et al.

(10) Patent No.: US 9,413,328 B2
(45) Date of Patent: Aug. 9, 2016

(54) DIPLEXER INCLUDING TWO BANDPASS FILTERS

(71) Applicant: TDK CORPORATION, Tokyo (JP)

(72) Inventors: Kazuhiro Tsukamoto, Tokyo (JP); Masanori Tsutsumi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 97 days.

(21) Appl. No.: 14/325,775

(22) Filed: Jul. 8, 2014

(65) Prior Publication Data

US 2015/0028965 A1 Jan. 29, 2015

(30) Foreign Application Priority Data

Jul. 23, 2013 (JP) ................. 2013-152370

(51) Int. Cl.
*H01P 5/12* (2006.01)
*H03H 7/46* (2006.01)
*H03H 7/01* (2006.01)

(52) U.S. Cl.
CPC .............. *H03H 7/461* (2013.01); *H03H 7/175* (2013.01); *H03H 7/1766* (2013.01); *H03H 7/1775* (2013.01)

(58) Field of Classification Search
CPC ..... H03H 7/461; H03H 7/175; H03H 7/1766; H03H 7/1775
USPC ......................................... 333/134, 132, 200
See application file for complete search history.

(56) References Cited

U.S. PATENT DOCUMENTS

| 4,091,344 | A | * | 5/1978 | LaTourrette | .......... | H01P 1/2136 333/134 |
| 6,411,178 | B1 | | 6/2002 | Matsumura et al. | | |
| 7,800,461 | B2 | | 9/2010 | Terada et al. | | |

FOREIGN PATENT DOCUMENTS

| EP | 2 575 253 A1 | 4/2013 |
| JP | 2003-204280 A | 7/2003 |
| JP | 2005-057342 A | 3/2005 |
| JP | 2006-211057 A | 8/2006 |
| JP | 2006-332980 A | 12/2006 |
| JP | A-2008-278361 | 11/2008 |
| JP | 2009-159328 A | 7/2009 |
| JP | 2010-141859 A | 6/2010 |

OTHER PUBLICATIONS

May 20, 2015 Office Action issued in Japanese Patent Application No. 2013-152370.

* cited by examiner

*Primary Examiner* — Robert Pascal
*Assistant Examiner* — Kimberly Glenn
(74) *Attorney, Agent, or Firm* — Oliff PLC

(57) ABSTRACT

A diplexer includes a first bandpass filter provided between an input terminal and a first output terminal and selectively passing a signal in a first frequency band, and a second bandpass filter provided between the input terminal and a second output terminal and selectively passing a signal in a second frequency band. The first bandpass filter includes a plurality of first resonators. The second bandpass filter includes a second resonator and a series resonant circuit. The series resonant circuit is composed of a capacitor provided between the input terminal and the second resonator, and an inductance component of a line that connects the input terminal and the second resonator via the capacitor.

7 Claims, 6 Drawing Sheets

DIPLEXER INCLUDING TWO BANDPASS FILTERS

BACKGROUND OF THE INVENTION

1. Field of the Invention

The present invention relates to a diplexer for allowing two signals in different frequency bands received at an input terminal to be separated from each other and be output from corresponding output terminals.

2. Description of the Related Art

Nowadays, while there is demand for downsizing of compact wireless communication apparatuses typified by cellular phones and smartphones, an increasing number of such communication apparatuses perform not only primary communication functions but also other communication functions such as those compatible with Bluetooth® standards or those for wireless LANs (local area networks).

In order for a single wireless communication apparatus to process a plurality of reception signals in different frequency bands, a means for separating the plurality of reception signals received at an antenna from each other is needed. A diplexer is known as a means for separating two reception signals in different frequency bands from each other.

These days, from the viewpoint of reducing the size and cost of wireless communication apparatuses, there is demand for diplexers that not only separate a plurality of reception signals from each other but also incorporate a bandpass filter, which has conventionally been provided to be located after a diplexer. For example, JP 2008-278361A discloses a diplexer incorporating a bandpass filter.

Typically, a diplexer incorporating at least one bandpass filter is provided with an input terminal, a first output terminal, a second output terminal, a first bandpass filter provided between the input terminal and the first output terminal, a second bandpass filter provided between the input terminal and the second output terminal, a first matching element provided between the input terminal of the diplexer and an input of the first bandpass filter, and a second matching element provided between the input terminal of the diplexer and an input of the second bandpass filter.

The first bandpass filter selectively passes a first signal of a frequency within a first frequency band. The second bandpass filter selectively passes a second signal of a frequency within a second frequency band higher than the first frequency band. Hereinafter, the signal path from the input terminal to the first output terminal will be referred to as the first signal path, and the signal path from the input terminal to the second output terminal will be referred to as the second signal path. An example of the first matching element is an inductor. An example of the second matching element is a capacitor.

In many cases, bandpass filters each including a plurality of resonators such as those disclosed in JP 2008-278361A are used as the first and second bandpass filters. In the bandpass filter disclosed in JP 2008-278361A, two adjacent resonators are electromagnetically coupled to each other.

A diplexer that incorporates first and second bandpass filters each including a plurality of resonators requires a large number of elements for forming the first and second signal paths, and thus has the drawback of being difficult to miniaturize. Further, an attempt to miniaturize such a diplexer would bring the elements for forming the first signal path closer to the elements for forming the second signal path, thereby causing unwanted coupling and/or stray capacitance between those elements. This may degrade isolation, generate spurious, and consequently lead to degradation of characteristics.

OBJECT AND SUMMARY OF THE INVENTION

It is an object of the present invention to provide a diplexer that includes two bandpass filters and achieves miniaturization without degradation of characteristics.

A diplexer of a first aspect of the present invention includes: an input terminal to receive a first signal of a frequency within a first frequency band and a second signal of a frequency within a second frequency band higher than the first frequency band; a first output terminal for outputting the first signal; a second output terminal for outputting the second signal; a first bandpass filter provided between the input terminal and the first output terminal and selectively passing the first signal; and a second bandpass filter provided between the input terminal and the second output terminal and selectively passing the second signal.

In the diplexer of the first aspect of the present invention, the first bandpass filter includes a plurality of first resonators. The second bandpass filter includes a second resonator, and a series resonant circuit connecting the input terminal and the second resonator. The series resonant circuit is composed of a capacitor provided between the input terminal and the second resonator, and an inductance component of a line that connects the input terminal and the second resonator via the capacitor.

In the diplexer of the first aspect of the present invention, the second resonator may have a first end connected to the second output terminal and a second end connected to a ground, and may be configured to produce parallel resonance.

In the diplexer of the first aspect of the present invention, each of the second resonator and the series resonant circuit may have a resonant frequency within the second frequency band.

The diplexer of the first aspect of the present invention may further include an inductor provided between the input terminal and the first bandpass filter.

A diplexer of a second aspect of the present invention includes: an input terminal to receive a first signal of a frequency within a first frequency band and a second signal of a frequency within a second frequency band higher than the first frequency band; a first output terminal for outputting the first signal; a second output terminal for outputting the second signal; a first bandpass filter provided between the input terminal and the first output terminal and selectively passing the first signal; an inductor provided between the input terminal and the first bandpass filter; and a second bandpass filter selectively passing the second signal of the first and second signals received at the input terminal and allowing the second signal to be output from the second output terminal.

In the diplexer of the second aspect of the present invention, the first bandpass filter includes a plurality of first resonators. Each of the plurality of first resonators has an end connected to a ground, and is configured to produce parallel resonance. The inductor has an inductance component and a stray capacitance. The inductance component and the stray capacitance of the inductor constitute a parallel resonant circuit. The second bandpass filter includes the parallel resonant circuit, and a second resonator provided between the input terminal and the second output terminal.

In the diplexer of the second aspect of the present invention, the second resonator may have a first end connected to the second output terminal and a second end connected to the ground, and may be configured to produce parallel resonance.

In the diplexer of the second aspect of the present invention, the second bandpass filter may further include a capacitor provided between the input terminal and the second resonator. The capacitor may capacitively couple the parallel resonant circuit and the second resonator to each other.

In the diplexer of the first aspect of the present invention, the second bandpass filter is composed of the single second resonator, and the series resonant circuit which is composed of the capacitor and the inductance component of the line. The present invention thus allows the number of elements included in the diplexer to be smaller than in the case of forming the second bandpass filter using a plurality of resonators each of which is composed of a dedicated inductor and a dedicated capacitor. Consequently, the present invention makes it possible to provide a diplexer that includes two bandpass filters and achieves miniaturization without degradation of characteristics.

In the diplexer of the second aspect of the present invention, the inductance component and the stray capacitance of the inductor provided between the input terminal and the first bandpass filter constitute a parallel resonant circuit. The second bandpass filter is composed of this parallel resonant circuit and the single second resonator. The present invention thus allows the number of elements included in the diplexer to be smaller than in the case of forming the second bandpass filter using a plurality of resonators each of which is composed of a dedicated inductor and a dedicated capacitor. Consequently, the present invention makes it possible to provide a diplexer that includes two bandpass filters and achieves miniaturization without degradation of characteristics.

Other and further objects, features and advantages of the invention will appear more fully from the following description.

DETAILED DESCRIPTION OF THE PREFERRED EMBODIMENTS

First Embodiment

Figure 1:
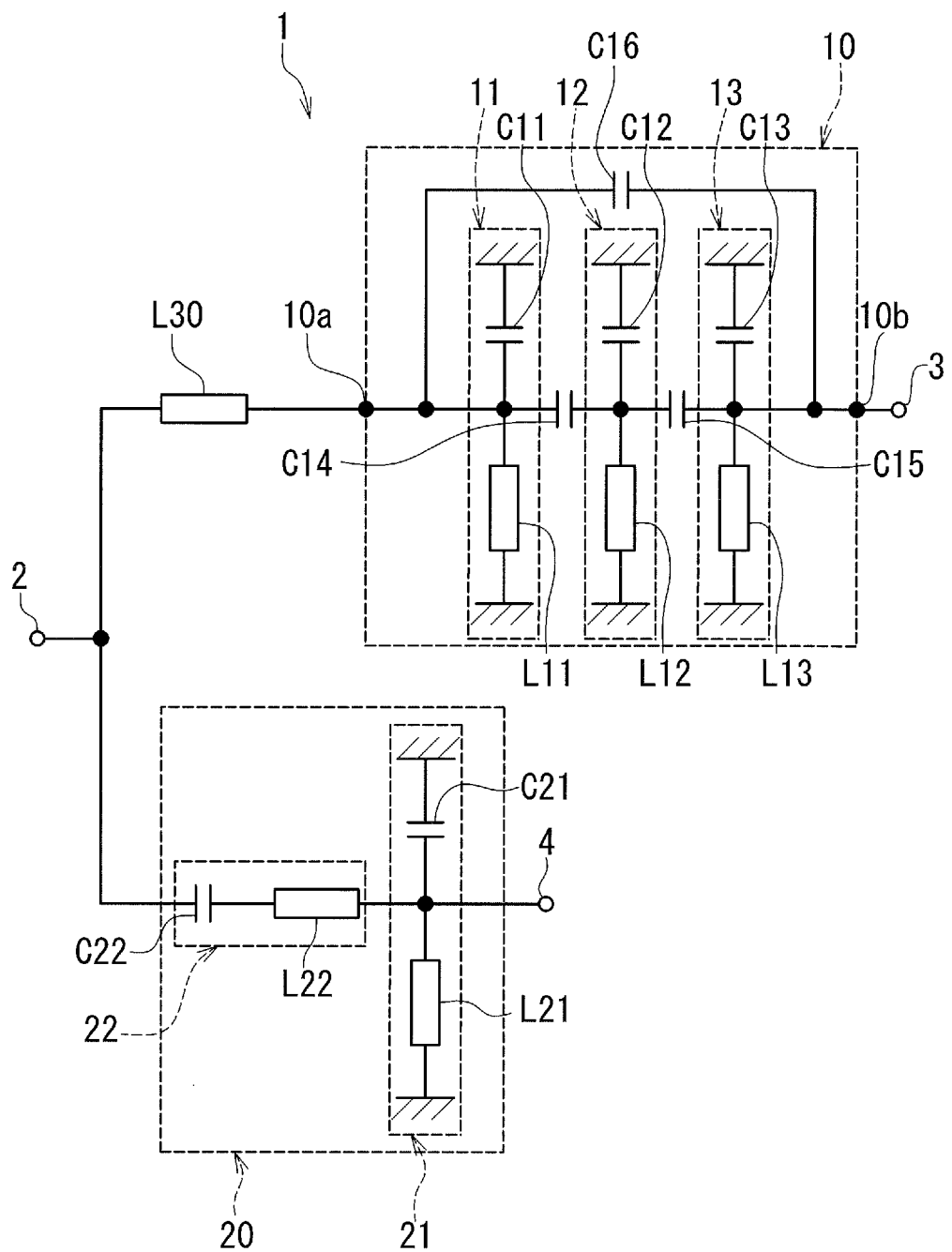
FIG. 1 is a circuit diagram illustrating the configuration of a diplexer according to a first embodiment of the invention.

Preferred embodiments of the present invention will now be described in detail with reference to the drawings. First, reference is made to FIG. 1 to describe the circuit configuration of a diplexer according to a first embodiment of the invention. The diplexer 1 according to the first embodiment is configured to separate a first signal of a frequency within a first frequency band and a second signal of a frequency within a second frequency band higher than the first frequency band from each other. The first frequency band is, for example, a 2.4-GHz band for use in IEEE 802.11b and IEEE 802.11g. The second frequency band is, for example, a 5-GHz band for use in IEEE 802.11a.

The diplexer 1 has an input terminal 2 to receive the first signal and the second signal, a first output terminal 3 for outputting the first signal, and a second output terminal 4 for outputting the second signal. Hereinafter, the signal path from the input terminal 2 to the first output terminal 3 will be referred to as the first signal path, and the signal path from the input terminal 2 to the second output terminal 4 will be referred to as the second signal path.

The diplexer 1 includes a first bandpass filter 10, a second bandpass filter 20, and an inductor L30. The first bandpass filter 10 is provided between the input terminal 2 and the first output terminal 3, and selectively passes the first signal. The inductor L30 is provided between the input terminal 2 and the first bandpass filter 10. The second bandpass filter 20 is provided between the input terminal 2 and the second output terminal 4, and selectively passes the second signal.

The first bandpass filter 10 includes a plurality of first resonators. FIG. 1 shows an example in which the first bandpass filter 10 includes an input 10a, an output 10b, three first resonators 11, 12 and 13 cascade-connected to each other between the input 10a and the output 10b, and capacitors C14, C15 and C16. The resonator 11 includes an inductor L11 and a capacitor C11. The resonator 12 includes an inductor L12 and a capacitor C12. The resonator 13 includes an inductor L13 and a capacitor C13.

A first end of the inductor L30 is connected to the input terminal 2. A second end of the inductor L30 is connected to the input 10a of the bandpass filter 10. A first end of the inductor L11 and a first end of each of the capacitors C11 and C14 are connected to the input 10a. A second end of the inductor L11 and a second end of the capacitor C11 are connected to the ground. A first end of the inductor L12 and a first end of each of the capacitors C12 and C15 are connected to a second end of the capacitor C14. A second end of the inductor L12 and a second end of the capacitor C12 are connected to the ground. A first end of the inductor L13, a first end of the capacitor C13 and the output 10b of the bandpass filter 10 are connected to a second end of the capacitor C15. A second end of the inductor L13 and a second end of the capacitor C13 are connected to the ground. A first end of the capacitor C16 is connected to the input 10a of the bandpass filter 10. A second end of the capacitor C16 is connected to the output 10b of the bandpass filter 10. The output 10b of the bandpass filter 10 is connected to the first output terminal 3.

Each of the resonators 11, 12 and 13 forms a parallel resonant circuit using an inductor and a capacitor connected in parallel, and is configured to produce parallel resonance. The capacitor C14 establishes capacitive coupling between the resonators 11 and 12 adjacent to each other. The capacitor C15 establishes capacitive coupling between the resonators 12 and 13 adjacent to each other. The capacitor C16 establishes capacitive coupling between the resonators 11 and 13 not adjacent to each other.

Inductances and capacitances of the inductors and capacitors constituting the first bandpass filter 10 are selected so that the first bandpass filter 10 has a pass band corresponding to the first frequency band.

The inductor L30 is a matching element for adjusting the impedance characteristic of the first signal path so that, for the first frequency band, the first signal path as viewed from the input terminal 2 has a reflection coefficient of 0 or near 0 in absolute value and, for the second frequency band, the first signal path as viewed from the input terminal 2 has a reflection coefficient of 1 or near 1, or in other words, is in an open or near-open state.

The second bandpass filter 20 includes a second resonator 21, and a series resonant circuit 22 connecting the input terminal 2 and the second resonator 21. The second resonator 21 includes an inductor L21 and a capacitor C21. A first end of each of the inductor L21 and the capacitor C21 is connected to the second output terminal 4. A second end of each of the inductor L21 and the capacitor C21 is connected to the ground. Thus, the second resonator 21 has a first end (the first end of each of the inductor L21 and the capacitor C21) connected to the second output terminal 4, and a second end (the second end of each of the inductor L21 and the capacitor C21) connected to the ground. The second resonator 21 forms a parallel resonant circuit using the inductor L21 and the capacitor C21 connected in parallel, and is configured to produce parallel resonance.

The series resonant circuit 22 is composed of a capacitor C22 provided between the input terminal 2 and the second resonator 21, and an inductance component L22 of a line that connects the input terminal 2 and the second resonator 21 via the capacitor C22. A first end of the capacitor C22 is connected to the input terminal 2 via a portion of the aforementioned line. A second end of the capacitor C22 is connected to the first end of each of the inductor L21 and the capacitor C21 via another portion of the aforementioned line.

The capacitor C22 is a matching element for adjusting the impedance characteristic of the second signal path so that, for the second frequency band, the second signal path as viewed from the input terminal 2 has a reflection coefficient of 0 or near 0 in absolute value and, for the first frequency band, the second signal path as viewed from the input terminal 2 has a reflection coefficient of 1 or near 1, or in other words, is in an open or near-open state.

In the diplexer 1 according to the first embodiment, the first bandpass filter 10 selectively passes the first signal of the first and second signals received at the input terminal 2, and allows the first signal to be output from the first output terminal 3. The second bandpass filter 20 selectively passes the second signal of the first and second signals received at the input terminal 2, and allows the second signal to be output from the second output terminal 4.

Figure 3:
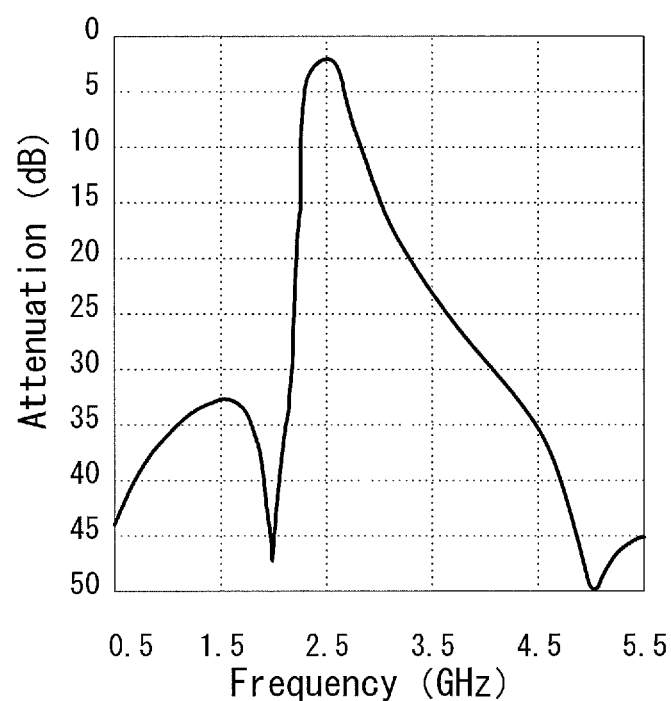
FIG. 3 is a characteristic diagram illustrating an example of frequency characteristics of a first signal path of the diplexer shown in FIG. 1.

FIG. 3 shows an example of frequency characteristics of the first signal path. In FIG. 3, the horizontal axis represents frequency, and the vertical axis represents attenuation. The curve in FIG. 3 indicates the insertion loss characteristic of the first signal path. The first frequency band, i.e., the pass band of the bandpass filter 10, is the frequency range in which the insertion loss characteristic of the first signal path shows an attenuation of 3 dB or smaller.

Figure 2:
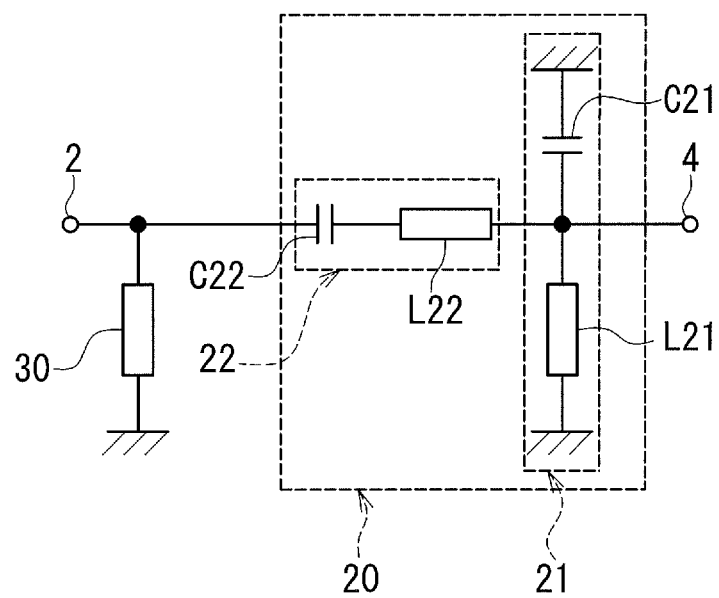
FIG. 2 is a circuit diagram illustrating an equivalent circuit for the diplexer shown in FIG. 1 for a second frequency band.

Now, the function of the diplexer 1 for the second frequency band will be described with reference to FIG. 2. FIG. 2 is a circuit diagram illustrating an equivalent circuit for the diplexer 1 for the second frequency band. In FIG. 2, the reference numeral 30 indicates an element equivalent to the first signal path for the second frequency band. For the second frequency band, the circuit configuration of the diplexer 1 can be considered as a configuration in which the element 30 is connected in parallel to the second signal path, as shown in FIG. 2. As mentioned previously, the impedance characteristic of the first signal path is adjusted so that, for the second frequency band, the first signal path as viewed from the input terminal 2 is in an open or near-open state. Consequently, the element 30 shown in FIG. 2 has an open or near-open impedance for the second frequency band.

The second bandpass filter 20 is composed of the second resonator 21 and the series resonant circuit 22. The second resonator 21 includes the inductor L21 and the capacitor C21 connected in parallel. The series resonant circuit 22 is composed of the capacitor 22, and the inductance component L22 of the line connecting the input terminal 2 and the second resonator 21 via the capacitor C22.

The second resonator 21 has a resonant frequency $f_{21}$ of $1/\{2\pi\sqrt{(L_{21}C_{21})}\}$, where $L_{21}$ is the inductance of the inductor L21, and $C_{21}$ is the capacitance of the capacitor C21. The series resonant circuit 22 has a resonant frequency $f_{22}$ of $1/\{2\pi\sqrt{(L_{22}C_{22})}\}$, where $L_{22}$ is the inductance of the inductance component L22, and $C_{22}$ is the capacitance of the capacitor C22. The resonant frequency $f_{21}$ of the second resonator 21 and the resonant frequency $f_{22}$ of the series resonant circuit 22 are both within the second frequency band. The inductance $L_{21}$ and the capacitance $C_{21}$ are selected so that the resonant frequency $f_{21}$ of a desired value is obtained. The capacitance $C_{22}$ is selected depending on the inductance $L_{22}$ so that the resonant frequency $f_{22}$ of a desired value is obtained.

Figure 4:
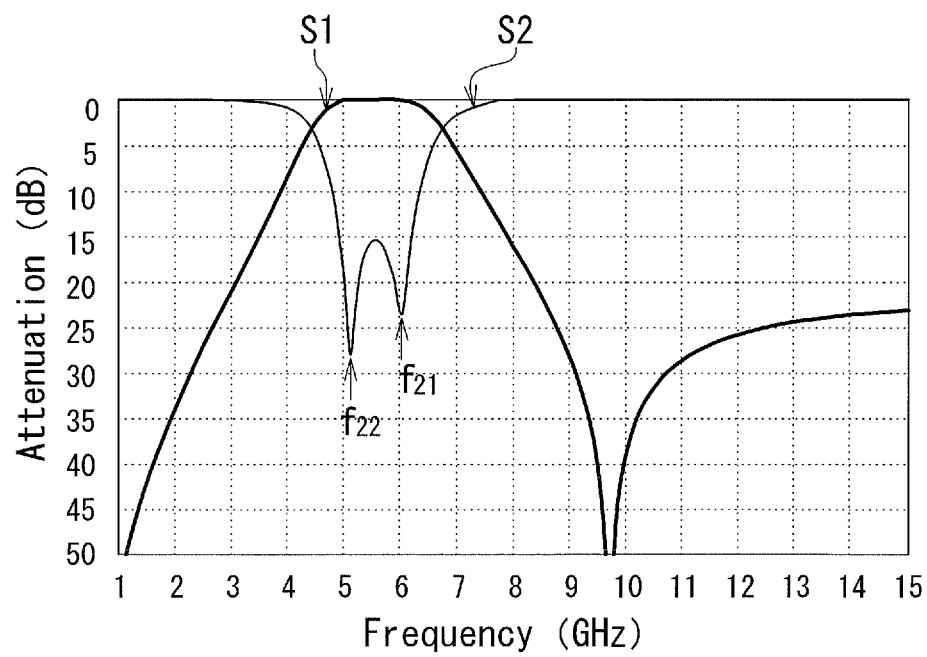
FIG. 4 is a characteristic diagram illustrating an example of frequency characteristics of a second signal path of the diplexer shown in FIG. 1.

FIG. 4 shows an example of frequency characteristics of the second signal path. In FIG. 4, the horizontal axis represents frequency, and the vertical axis represents attenuation. In FIG. 4, the curve labeled S1 indicates the insertion loss characteristic of the second signal path, and the curve labeled S2 indicates the return loss characteristic of the second signal path. The second frequency band, i.e., the pass band of the bandpass filter 20, is the frequency range in which the insertion loss characteristic S1 of the second signal path shows an attenuation of 3 dB or smaller. In the example shown in FIG. 4, the return loss characteristic S2 of the second signal path shows peaks at two different resonant frequencies $f_{22}$ and $f_{21}$ in the second frequency band.

Figure 5:
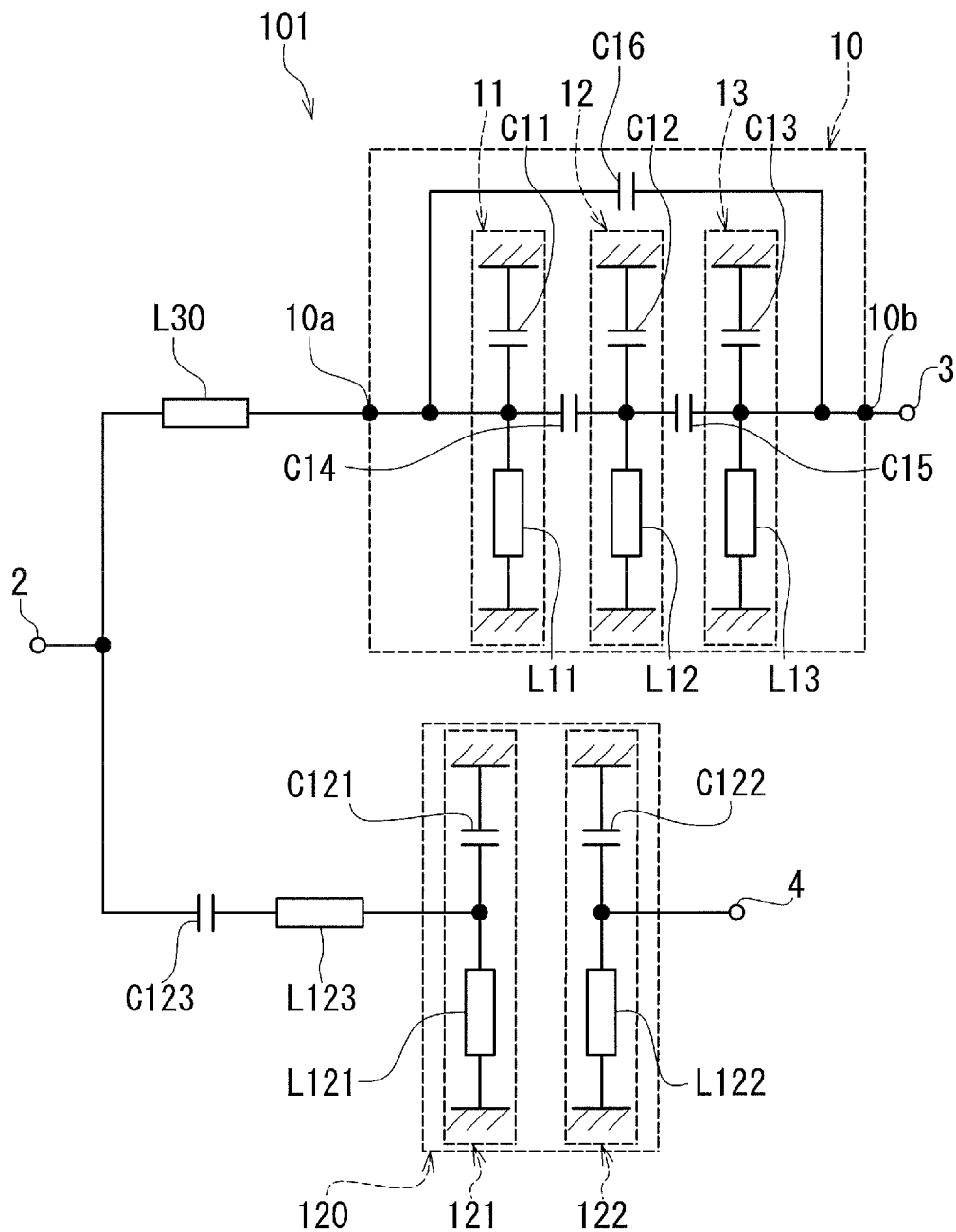
FIG. 5 is a circuit diagram illustrating a configuration of a diplexer of a comparative example.

The effects of the diplexer 1 according to the first embodiment will now described in comparison with a diplexer of a comparative example shown in FIG. 5. The configuration of the diplexer 101 of the comparative example shown in FIG. 5 will be described first. The diplexer 101 differs from the diplexer 1 in the configuration of the second signal path. The diplexer 101 includes a second bandpass filter 120 and a capacitor C123, in place of the second bandpass filter 20 of the diplexer 1. The capacitor C123 is provided between the bandpass filter 120 and the input terminal 2. In FIG. 5, the reference symbol L123 indicates an inductance component of a line that connects the input terminal 2 and the bandpass filter 120 via the capacitor C123.

The bandpass filter 120 includes two resonators 121 and 122. The two resonators 121 and 122 are electromagnetically coupled to each other. The resonator 121 includes an inductor L121 and a capacitor C121. The resonator 122 includes an inductor L122 and a capacitor C122. A first end of the inductor L121 and a first end of the capacitor C121 are connected to the capacitor C123 via the line mentioned above. A second end of the inductor L121 and a second end of the capacitor C121 are connected to the ground. A first end of the inductor L122 and a first end of the capacitor C122 are connected to the second output terminal 4. A second end of the inductor L122 and a second end of the capacitor C122 are connected to the ground.

For the diplexer 101 of the comparative example, no adjustment is made to allow the resonant frequency determined by the capacitance of the capacitor C123 and the inductance of the inductance component L123 to fall within the second frequency band. This resonant frequency is typically higher than the second frequency band. Thus, the capacitor C123 and the inductance component L123 do not constitute part of the bandpass filter 120.

The diplexer 101 of the comparative example requires a large number of elements for forming the first and second signal paths, and thus has the drawback of being difficult to miniaturize. Further, an attempt to miniaturize the diplexer 101 would bring the elements for forming the first signal path closer to the elements for forming the second signal path, thereby causing unwanted coupling and/or stray capacitance between those elements. This may degrade isolation, generate spurious, and consequently lead to degradation of characteristics.

In contrast, in the diplexer 1 according to the first embodiment, the second bandpass filter 20 is composed of the single second resonator 21, and the series resonant circuit 22 which is composed of the capacitor C22 and the inductance component L22 of the line. The diplexer 1 according to the first embodiment thus allows the number of elements constituting the second bandpass filter 20 to be smaller than in the case of the diplexer 101 of the comparative example in which the second bandpass filter 120 is formed using a plurality of resonators 121 and 122 each of which is composed of a dedicated inductor and a dedicated capacitor.

The diplexer 1 requires the capacitor C22 to form the series resonant circuit 22. On the other hand, the diplexer 101 of the comparative example is provided with the capacitor C123. Therefore, in the diplexer 1, the formation of the series resonant circuit 22 does not result in an increased number of elements when compared with the diplexer 101.

Consequently, the diplexer 1 according to the first embodiment achieves a reduction in the number of elements included in the diplexer 1, particularly in the number of elements for forming the second signal path, when compared with the diplexer 101 of the comparative example. The first embodiment thus makes it possible to prevent unwanted coupling and stray capacitance from occurring between the elements for forming the first signal path and the elements for forming the second signal path as the diplexer becomes miniaturized, and consequently makes it possible to prevent degradation of characteristics, such as degradation of isolation and spurious generation. The first embodiment thus provides the diplexer 1 including two bandpass filters 10 and 20 and achieving miniaturization without degradation of characteristics.

Second Embodiment

Figure 6:
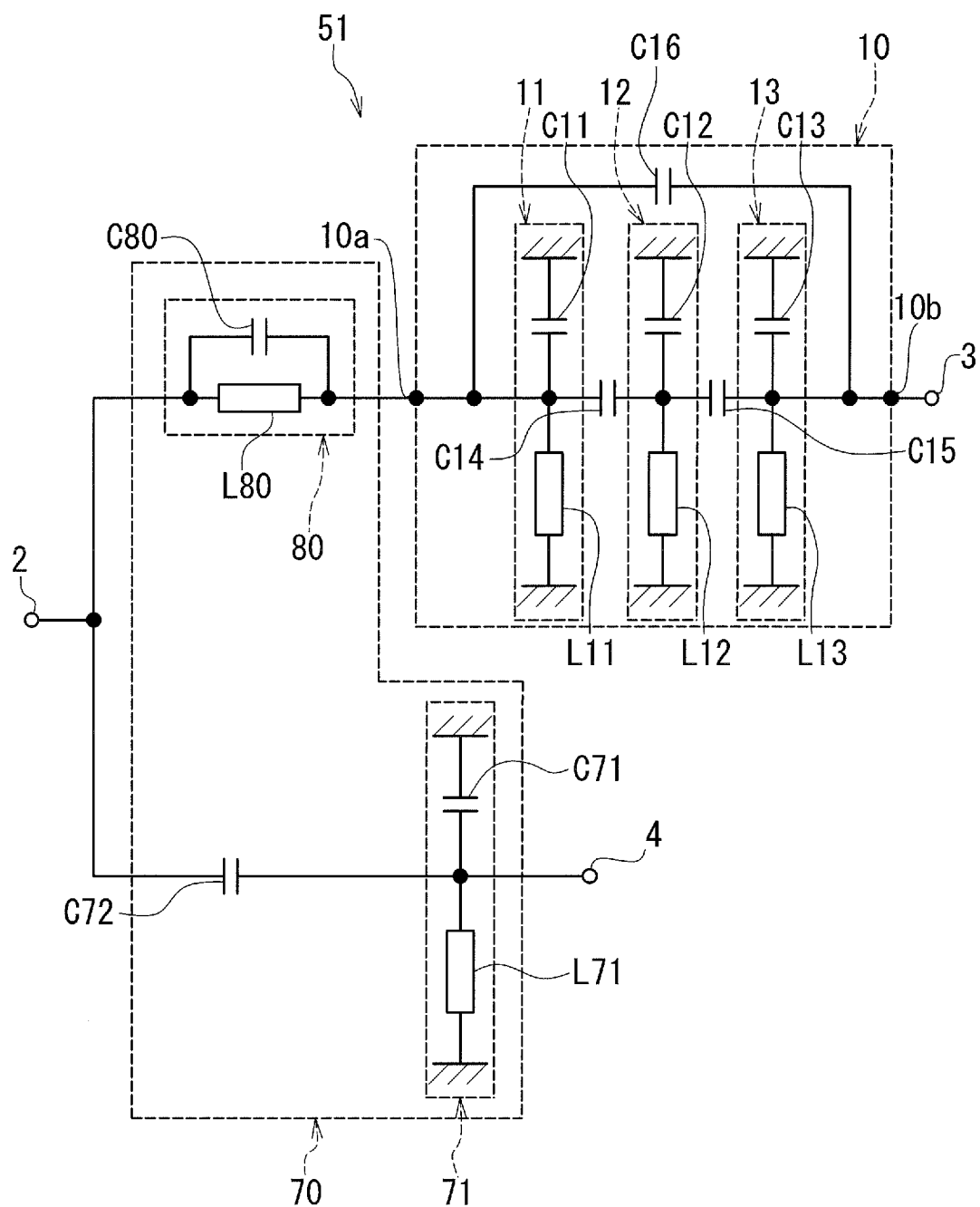
FIG. 6 is a circuit diagram illustrating the configuration of a diplexer according to a second embodiment of the invention.

A diplexer according to a second embodiment of the invention will now be described. FIG. 6 is a circuit diagram illustrating the configuration of the diplexer according to the second embodiment. The diplexer 51 according to the second embodiment differs from the diplexer 1 according to the first embodiment in the following ways. The diplexer 51 according to the second embodiment includes an inductor 80 in place of the inductor L30 of the diplexer 1 according to the first embodiment. The inductor 80 is provided between the input terminal 2 and the first bandpass filter 10. The inductor 80 has an inductance component L80 and a stray capacitance C80. The stray capacitance C80 is connected in parallel to the inductance component L80. The inductance component L80 and the stray capacitance C80 of the inductor 80 constitute a parallel resonant circuit.

Further, the diplexer 51 according to the second embodiment includes a second bandpass filter 70 in place of the second bandpass filter 20 of the diplexer 1. The second bandpass filter 70 selectively passes the second signal of the first and second signals received at the input terminal 2, and allows the second signal to be output from the second output terminal 4. The second bandpass filter 70 includes a second resonator 71 provided between the input terminal 2 and the second output terminal 4, a capacitor C72 provided between the input terminal 2 and the second resonator 71, and the parallel resonant circuit mentioned above. The capacitor C72 is a matching element for adjusting the impedance characteristic of the second signal path, like the capacitor C22 of the first embodiment. Because the capacitor C72 is not used for forming any series resonant circuit in the second embodiment, FIG. 6 does not show the inductance component of a line that connects the input terminal 2 and the second resonator 21 via the capacitor C72.

In the second embodiment, as described above, the inductance component L80 and the stray capacitance C80 of the inductor 80 constitute a parallel resonant circuit, and this parallel resonant circuit forms part of the second bandpass filter 70. This will now be described in detail with reference to FIG. 7.

Figure 7:
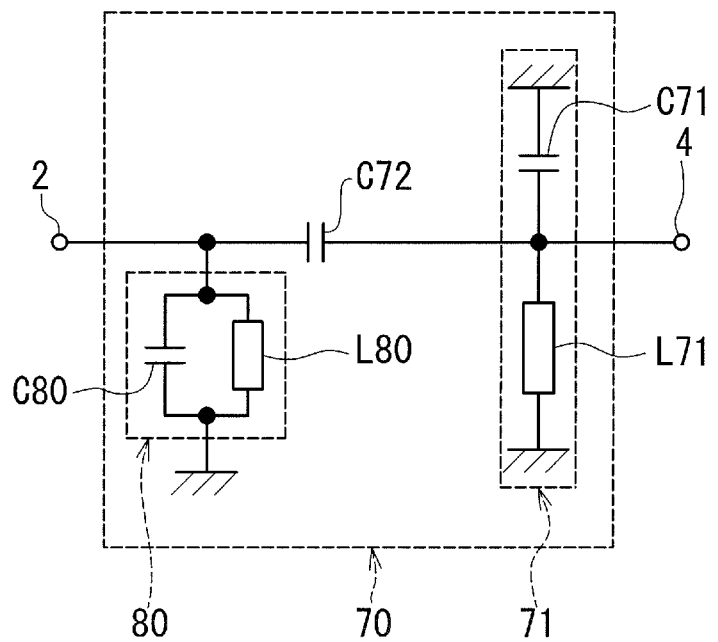
FIG. 7 is a circuit diagram illustrating an equivalent circuit for the diplexer shown in FIG. 6 for the second frequency band.

FIG. 7 is a circuit diagram illustrating an equivalent circuit for the diplexer 51 for the second frequency band. In the second frequency band, the capacitors C11, C12, C13, C14 and C15 included in the first bandpass filter 10 have sufficiently low impedances. Therefore, for the second frequency band, the circuit configuration of the diplexer 51 can be considered as a configuration in which the inductor 80 is provided between the input terminal 2 and the ground, and is connected in parallel to the second signal path, as shown in FIG. 7.

As mentioned above, the inductance component L80 and the stray capacitance C80 of the inductor 80 constitute a parallel resonant circuit. The capacitor C72 capacitively couples the parallel resonant circuit and the first resonator 71 to each other. Thus, in the second embodiment, the second bandpass filter 70 is composed of the parallel resonant circuit, the first resonator 71 and the capacitor C72.

Here, let $L_{71}$ be the inductance of the inductor L71, let $C_{71}$ be the capacitance of the capacitor C71, and let $C_{72}$ be the capacitance of the capacitor C72. Further, let $L_{80}$ be the inductance of the inductance component L80, and let $C_{80}$ be the capacitance of the stray capacitance C80.

The aforementioned parallel resonant circuit has a resonant frequency of $1/\{2\pi\sqrt{(L_{80}C_{80})}\}$. The second resonator 71 has a resonant frequency of $1/\{2\pi\sqrt{(L_{71}C_{71})}\}$. In the second embodiment, the inductances $L_{71}$ and $L_{80}$ and the capacitances $C_{71}$, $C_{72}$ and $C_{80}$ are selected so that the second bandpass filter 70 has a pass band corresponding to the second frequency band.

Figure 8:
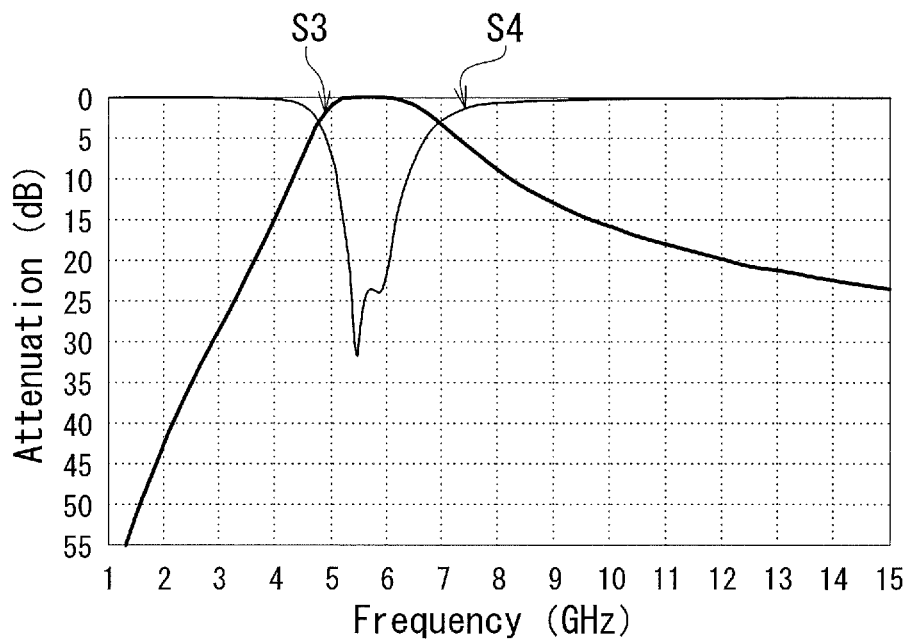
FIG. 8 is a characteristic diagram illustrating an example of frequency characteristics of the second signal path of the diplexer shown in FIG. 6.

FIG. 8 shows an example of frequency characteristics of the second signal path of the second embodiment. In FIG. 8, the horizontal axis represents frequency, and the vertical axis represents attenuation. In FIG. 8, the curve labeled S3 indicates the insertion loss characteristic of the second signal path, and the curve labeled S4 indicates the return loss characteristic of the second signal path. The second frequency band, i.e., the pass band of the bandpass filter 70, is the frequency range in which the insertion loss characteristic of the second signal path shows an attenuation of 3 dB or smaller.

As described above, in the diplexer 51 according to the second embodiment, the inductance component L80 and the stray capacitance C80 of the inductor 80 provided between the input terminal 2 and the first bandpass filter 10 constitute a parallel resonant circuit. This parallel resonant circuit and the single second resonator 71 constitute the second bandpass filter 70. The diplexer 51 according to the second embodiment thus allows the number of elements constituting the second bandpass filter 70 to be smaller than in the case of the diplexer 101 of the comparative example shown in FIG. 5 in which the second bandpass filter 120 is formed using a plurality of resonators 121 and 122 each of which is composed of a dedicated inductor and a dedicated capacitor.

The second bandpass filter 70 includes, in addition to the second resonator 71, the parallel resonant circuit composed of the inductance component L80 and the stray capacitance C80 of the inductor 80. However, since the inductor 80 is an element for adjusting the impedance characteristic of the first signal path, the formation of the aforementioned parallel resonant circuit does not result in an increased number of elements in the diplexer 51 when compared with the diplexer 101.

Consequently, the diplexer 51 according to the second embodiment achieves a reduction in the number of elements included in the diplexer 51, particularly in the number of elements for forming the second signal path, when compared with the diplexer 101 of the comparative example. The second embodiment thus makes it possible to prevent unwanted coupling and stray capacitance from occurring between the elements for forming the first signal path and the elements for forming the second signal path as the diplexer becomes miniaturized, and consequently makes it possible to prevent degradation of characteristics, such as degradation of isolation and spurious generation. The second embodiment thus provides the diplexer 51 including two bandpass filters 10 and 70 and achieving miniaturization without degradation of characteristics.

The remainder of configuration, function and effects of the second embodiment are similar to those of the first embodiment.

The present invention is not limited to the foregoing embodiments, and various modifications may be made thereto. For example, the configuration of the first bandpass filter 10 is not limited to the one including three first resonators 11, 12 and 13 as illustrated in the foregoing embodiments, but may be one including only two first resonators, or four or more first resonators.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A diplexer comprising:
an input terminal to receive a first signal of a frequency within a first frequency band and a second signal of a frequency within a second frequency band higher than the first frequency band;
a first output terminal for outputting the first signal;
a second output terminal for outputting the second signal;
a first bandpass filter provided between the input terminal and the first output terminal and selectively passing the first signal; and
a second bandpass filter provided between the input terminal and the second output terminal and selectively passing the second signal, wherein
the first bandpass filter includes a plurality of first resonators,
the second bandpass filter is directly connected to the second output terminal and is composed only of a second resonator and a series resonant circuit, the series resonant circuit connecting the input terminal and the second resonator, and
the series resonant circuit is composed of a capacitor provided between the input terminal and the second resonator, and an inductance component of a line that connects the input terminal and the second resonator via the capacitor.

2. The diplexer according to claim 1, wherein the second resonator has a first end connected to the second output terminal and a second end connected to a ground, and is configured to produce parallel resonance.

3. The diplexer according to claim 1, wherein each of the second resonator and the series resonant circuit has a resonant frequency within the second frequency band.

4. The diplexer according to claim 1, further comprising an inductor provided between the input terminal and the first bandpass filter.

5. A diplexer comprising:
an input terminal to receive a first signal of a frequency within a first frequency band and a second signal of a frequency within a second frequency band higher than the first frequency band;
a first output terminal for outputting the first signal;
a second output terminal for outputting the second signal;
a first bandpass filter provided between the input terminal and the first output terminal and selectively passing the first signal;
an inductor provided between the input terminal and the first bandpass filter; and
a second bandpass filter selectively passing the second signal of the first and second signals received at the input terminal and allowing the second signal to be output from the second output terminal, wherein
the first bandpass filter includes a plurality of first resonators,
each of the plurality of first resonators has an end connected to a ground, and is configured to produce parallel resonance,
the inductor has an inductance component and a stray capacitance,
the inductance component and the stray capacitance of the inductor constitute a parallel resonant circuit, and
the second bandpass filter includes the parallel resonant circuit, and a second resonator provided between the input terminal and the second output terminal.

6. The diplexer according to claim 5, wherein the second resonator has a first end connected to the second output terminal and a second end connected to the ground, and is configured to produce parallel resonance.

7. The diplexer according to claim 5, wherein
the second bandpass filter further includes a capacitor provided between the input terminal and the second resonator, and
the capacitor capacitively couples the parallel resonant circuit and the second resonator to each other.

* * * * *